(12) United States Patent
Wang

(10) Patent No.: US 12,019,949 B2
(45) Date of Patent: Jun. 25, 2024

(54) METHOD FOR AUDIO MIXING, TERMINAL DEVICE, AND NON-TRANSITORY COMPUTER-READABLE MEDIUM

(71) Applicant: NETEASE (HANGZHOU) NETWORK CO.,LTD., Zhejiang (CN)

(72) Inventor: Runqi Wang, Zhejiang (CN)

(73) Assignee: NETEASE (HANGZHOU) NETWORK CO., LTD., Zhejiang (CN)

( * ) Notice: Subject to any disclaimer, the term of this patent is extended or adjusted under 35 U.S.C. 154(b) by 160 days.

(21) Appl. No.: 17/636,908

(22) PCT Filed: Feb. 24, 2020

(86) PCT No.: PCT/CN2020/076359
§ 371 (c)(1),
(2) Date: Feb. 21, 2022

(87) PCT Pub. No.: WO2021/051742
PCT Pub. Date: Mar. 25, 2021

(65) Prior Publication Data
US 2022/0358965 A1    Nov. 10, 2022

(30) Foreign Application Priority Data

Sep. 16, 2019    (CN) .......................... 201910873524.4

(51) Int. Cl.
G06F 3/16    (2006.01)
G10L 21/034    (2013.01)
H04R 3/04    (2006.01)

(52) U.S. Cl.
CPC ............ G06F 3/165 (2013.01); G10L 21/034 (2013.01); H04R 3/04 (2013.01); *H04R 2430/01* (2013.01)

(58) Field of Classification Search
CPC .. H04R 3/04; H04R 2430/01; H04R 2420/01; G06F 3/165; G06F 3/16
(Continued)

(56) References Cited

U.S. PATENT DOCUMENTS 9,973,163 B1 *   5/2018   Desmond ............... H03G 5/025
2009/0279707 A1   11/2009   Swartz

FOREIGN PATENT DOCUMENTS

CN    102378085 A    3/2012
CN    103177727 A    6/2013
(Continued)

OTHER PUBLICATIONS

The International Search Report dated Jun. 8, 2020 for PCT international application No. PCT/CN2020/076359.
(Continued)

*Primary Examiner* — Norman Yu
(74) *Attorney, Agent, or Firm* — Qinghong Xu

(57) ABSTRACT

Provided are a method and device for audio mixing, and non-transitory computer-readable medium. The method comprises: acquiring a current system volume parameter of a terminal apparatus; adjusting an audio mixing parameter for audio material according to the system volume parameter and a frequency range of the audio material; performing audio mixing processing on the audio material according to the audio mixing parameter; and playing the processed audio material. In the invention, an audio mixing parameter of audio material can be adjusted according to an acquired current system volume parameter of a terminal apparatus and a frequency of the audio material, thereby applying different audio mixing parameters to the audio material according to different system volume parameters, and accordingly playing the audio material according to the audio mixing parameters.

19 Claims, 10 Drawing Sheets

(58) Field of Classification Search
USPC ... 381/104, 103, 74, 106, 98, 101, 107, 109, 381/119, 56, 71.12, 80
See application file for complete search history.

(56) References Cited

FOREIGN PATENT DOCUMENTS

| | | | |
|---|---|---|---|
| CN | 106210247 | A | 12/2016 |
| CN | 106228999 | A | 12/2016 |
| CN | 106681684 | * | 5/2017 |
| CN | 106681684 | A | 5/2017 |
| CN | 109040885 | A | 12/2018 |
| CN | 109195068 | A | 1/2019 |
| CN | 109889170 | A | 6/2019 |
| CN | 110600062 | A | 12/2019 |
| JP | H07306689 | A | 11/1995 |

OTHER PUBLICATIONS

The 1st Office Action dated Apr. 30, 2020 for CN patent application No. 201910873524.4.
The Notice of Allowance dated Jan. 4, 2021 for CN patent application No. 201910873524.4.

* cited by examiner

METHOD FOR AUDIO MIXING, TERMINAL DEVICE, AND NON-TRANSITORY COMPUTER-READABLE MEDIUM

CROSS-REFERENCE

The present application is based upon International Application No. PCT/CN2020/076359, filed on Feb. 24, 2020, which is based upon and claims priority of Chinese patent application No. 201910873524.4, filed on Sep. 16, 2019, the contents of which are hereby incorporated by reference in its entirety.

TECHNICAL FIELD

The present disclosure relates to the field of audio processing technologies, and in particular, to a method and device for audio mixing, and non-transitory computer-readable medium.

BACKGROUND

In the related art, when engineers mix a variety of audio materials, they usually adjust a set of fixed audio mixing schemes based on human hearing when an audio is playing a device; when the audio materials are played based on the audio mixing schemes, audio playback volume of each frequency band in the audio material usually linearly changes with a change of system volume.

SUMMARY

In view of the above, an objective of the present disclosure is to provide a method and device for audio mixing, and non-transitory computer-readable medium.

According to an embodiment of the present disclosure provides an audio mixing method, applied to a terminal device. The method includes: acquiring a current system volume parameter of the terminal device; adjusting an audio mixing parameter of an audio material according to the system volume parameter and a frequency of the audio material; performing the audio mixing processing on the audio material according to the audio mixing parameter; and playing the processed audio material.

According to another embodiment of the present disclosure provides a terminal device, comprising a processor and a memory, wherein the memory stores computer executable instructions that are executed by the processor, and the processor is configured to: acquire a current system volume parameter of the terminal device; adjust an audio mixing parameter of an audio material according to the system volume parameter and a frequency range of the audio material; perform the audio mixing processing on the audio material according to the audio mixing parameter; and play the processed audio material.

According to another embodiment of the present disclosure provides a non-transitory computer-readable storage medium, wherein the non-transitory computer-readable storage medium stores computer executable instructions that, when called and executed by the processor, causes the processor to: acquire a current system volume parameter of the terminal device; adjust an audio mixing parameter of an audio material according to the system volume parameter and a frequency range of the audio material; perform audio mixing processing on the audio material according to the audio mixing parameter; and play the processed audio material.

BRIEF DESCRIPTION OF THE DRAWINGS

In order to more clearly illustrate the specific embodiments of the present disclosure or the technical solutions in the related art, the following will briefly introduce drawings that need to be used in describing the specific embodiments or related art. It is apparent that the drawings in the following description show only some of the embodiments of the present disclosure, and other drawings may be acquired by those skilled in the art without paying for creative labor.

DETAILED DESCRIPTION

Figure 1:
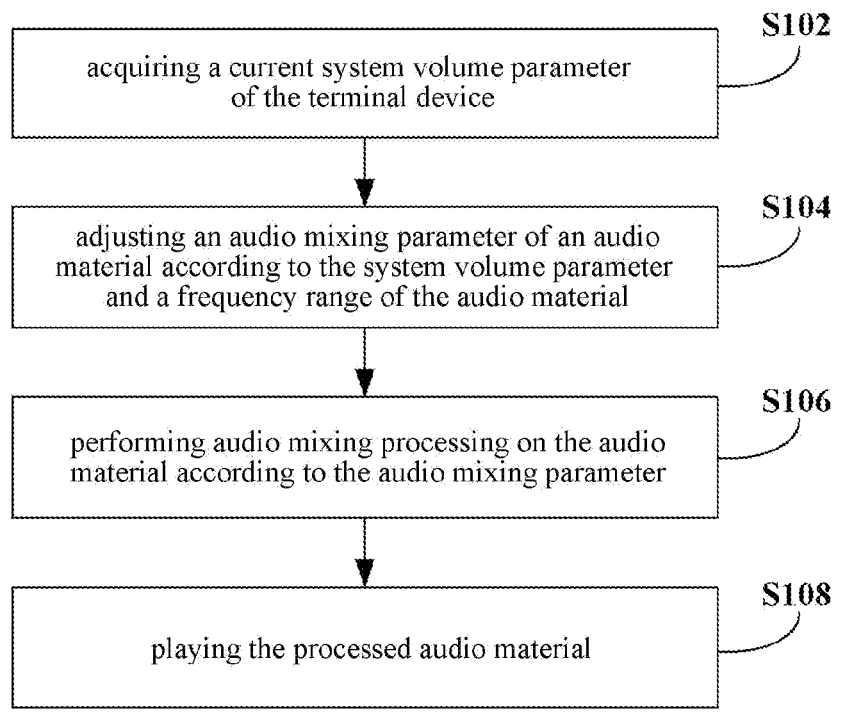
FIG. 1 is a flowchart of an audio mixing method provided by an embodiment of the present disclosure.

In order to make the objectives, technical solutions and advantages of embodiments of the present disclosure clearer, the technical solutions of the present disclosure will be described clearly and completely in conjunction with the accompanying drawings. Obviously, the described embodiments are part of the embodiments of the present disclosure, rather than all of the embodiments. Based on the embodiments of the present disclosure, all other embodiments acquired by those of ordinary skill in the art without creative work shall fall within the protection scope of the present disclosure.

When external audios are introduced into human ears, people form a subjective perception of audio strength and weakness. People are accustomed to describing an intensity of a sound wave with "loud" and "not loud", but this description is not completely equivalent to the intensity of the sound wave. The human ear's perception of the loudness of the sound wave is also related to the frequency of the sound wave. Even audios with the same audio pressure level but different frequencies will sound differently to the human ears in terms of the loudness. For a terminal device such as a mobile phone, the hearing of audios with different frequencies under the same loudspeaker volume is different, and the hearing changes of the audios with different frequencies are also different with the same change magnitude of the loudspeaker volume. The loudspeaker of the mobile terminal device may exacerbate the difference in the hearing at different frequencies due to its inherent hardware drawbacks.

Existing audio mixing schemes usually aim at the actual hearing of the terminal device. A fixed audio mixing scheme is adopted for the overall volume area. However, the human hearing has different sensitivities for the audios in different frequency bands. For example, under equal hearing effects, high frequency audios require lower volume than low frequency audios; in addition, the sensitivity is also affected by the system volume and playback hardware. As a result, the hearing effect of the audio of each frequency band reaching the human ear will not change linearly with the change of the system volume, and inherent disadvantages of the hardware will exacerbate this differentiation. For example, under the same playback volume, the high frequency audio of the audio material played by a loudspeaker in a mobile phone reaches the human ear with higher loudness than that of the low frequency audio; when the user adjusts the system volume, the audio of each frequency band reaches the human ear with different change trends in loudness, resulting in differences in the hearing of the audios in each frequency band at different volume, thereby affecting the user's hearing experience. Based on this, the embodiments of the present disclosure provide a method and device for audio mixing, and a terminal device. The technologies are applied to a device that may realize human computer interaction, such as a mobile phone, a tablet computer, and is especially suitable for a game scenario, such as a music game, a card game, and a competitive game.

In order to facilitate the understanding of the embodiment, a detailed introduction of an audio mixing method disclosed in the embodiments of the present disclosure is given first. The audio mixing method may be applied to a terminal device. Specifically, a main body that executes the audio mixing method may be an audio engine of the terminal device. A game engine sends a related parameter such as system volume and a playback instruction to the audio engine.

As shown in FIG. 1, the audio mixing method includes the following steps.

In step S102, a current system volume parameter of the terminal device is acquired.

The terminal device is usually a device that may realize human computer interaction, and the terminal device may be a device such as a mobile phone and a tablet computer. The current system volume parameter may be understood as a parameter related to a volume level of an audio played by the terminal device. For example, the system volume parameter may be preset to 0% to 100%. The larger the parameter is, the greater the volume of the audio played by the terminal device is. The user may adjust the system volume parameter by adjusting a volume button of the terminal device, or may also adjust the system volume parameter by adjusting a volume control of an application. Generally speaking, the user may adjust the system volume parameter at any time in different scenarios, and the terminal device may acquire the system volume parameter adjusted by the user in real time.

In an actual implementation, the audio engine installed in the terminal device may acquire the system volume parameter; the game engine, an audio and video playback software, etc. may also send information, such as the system volume parameter, an audio and video playback instructions, to the audio engine.

In step S104, an audio mixing parameter of an audio material is adjusted according to the system volume parameter and a frequency range of the audio material.

The audio material is an audio to be mixed. In many scenes, multiple audio materials need to be played at the same time. For example, in a game scene, it may be necessary to play a background music material, a weapon audio material, an information prompt audio material, a character dialogue audio material and the like at the same time. The frequency refers to a specific hertz, and the frequency range may also be understood as a frequency band. Each audio material usually contains a relatively broad frequency band. During the audio mixing process, there is a need to adjust the volume of each frequency band in the audio material, to form hearing characteristics of different audio materials. Each audio material usually contains a low frequency range, a medium frequency range, and a high frequency range, in which one or more of the frequency ranges may be used as a main range of the audio material. For example, for a sharper information prompt audio material, the main range of this audio material is usually the high frequency range. For an audio material with a low pitched beast roar, the main range of this audio material is usually the low frequency range. As an example, the low frequency range may be set to 30 Hz-150 Hz, in which a frequency below 50 Hz is an extremely low frequency range; the medium frequency range may be set to 150 Hz-5000 Hz, in which 500 Hz-5000 Hz is a medium and high frequency range, and 150 Hz-500 Hz is a medium and low frequency range; the high frequency range may be set to 5000 Hz-16000 Hz.

The audio mixing parameter may be understood as a parameter that affects the user's hearing when listening to the audio material. The audio mixing parameter usually includes a parameter such as volume of the audio material, volume of each frequency band in the audio material, and a dynamic range of the audio material. The dynamic range refers to a difference between the lowest volume and the highest volume of the audio; the adjusting the audio mixing parameter usually refers to adjusting a magnitude or range of the audio mixing parameter. Typically, if the system volume parameter becomes large, the volume of the audio material increases; if the system volume parameter becomes small, the volume of the audio material decreases. In an actual implementation, considering different performances of different frequency ranges in the audio material under different volume, the system volume parameter and the frequency range of the audio material to be mixed are used as the basis to adjust the audio mixing parameter of the audio material. For example, under a high volume, the volume of the high frequency range in the audio material is decreased to avoid the high frequency range of the audio material too sharp; under a low volume, the volume of the high frequency range in the audio material is increased to avoid expressiveness in the high frequency range of the audio material too low.

In step S106, an audio mixing processing is performed on the audio material according to the audio mixing parameter.

For example, the user adjusts the system volume parameter by means of the volume button in the terminal device, and the audio playback software in the terminal device acquires the system volume parameter with a preset interval, so that the adjusted system volume parameter is fed back to the audio engine in real time. The music play software adjusts the audio mixing parameters such as the volume of each currently played audio, the volume of each frequency band in the audio material and the dynamic range of the audio material on the basis of the adjusted system volume parameter through an audio mixing tool therein, so as to realize the audio mixing processing on the audio material.

In step S108, the processed audio material is played.

After the audio mixing processing on the audio material is completed, the terminal device plays the audio material after the audio mixing processing. Usually, the adjusted audio material may be played by the loudspeaker or an earphone of the terminal device.

The audio mixing method provided by the embodiments of the present disclosure adjust the audio mixing parameter of the audio material according to the acquired current system volume parameter of the terminal device and the frequency range of the audio material, and further perform the audio mixing processing on the audio material according to the audio mixing parameter, and play the audio material. The method considers the system volume parameter and the frequency range of the audio material when adjusting the audio mixing parameter. Compared with the related art in which a fixed audio mixing scheme is used under any system volume parameter, the above method may use different audio mixing parameters for the audio material under different system volume parameters. Therefore, this method may reduce the hearing difference of the audio material at different volume, the user may acquire comfortable hearing under various volume, which improves the user's hearing experience.

The embodiments of the present disclosure also provide another audio mixing method; this method is implemented on the basis of the method in the above embodiment; the method focuses on a specific implementation of adjusting the audio mixing parameter of the audio material according to the system volume parameter and the frequency of the audio material.

Figure 2:
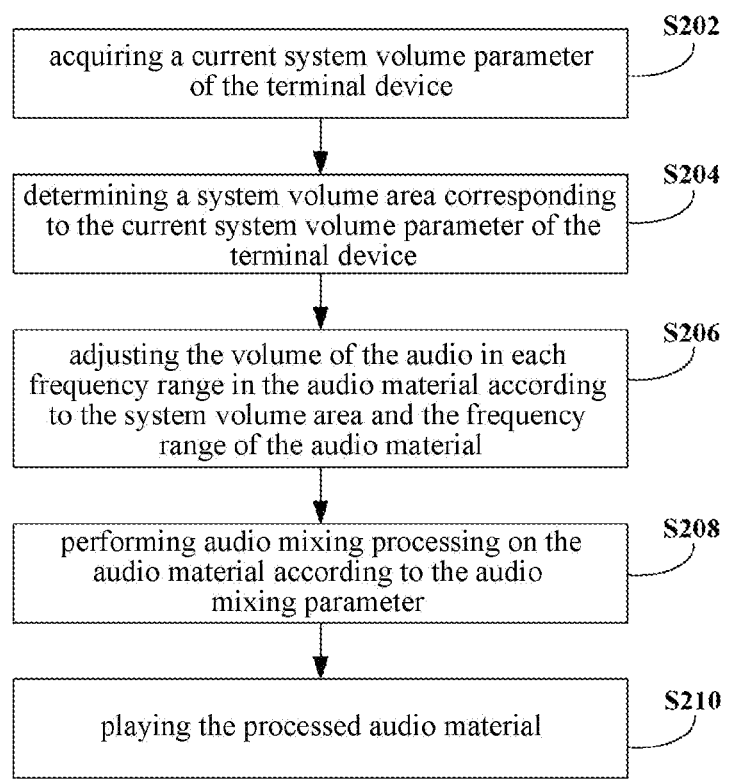
FIG. 2 is a flowchart of another audio mixing method provided by an embodiment of the present disclosure.

Based on the above description, as shown in FIG. 2, the method includes the following steps.

In step S202, a current system volume parameter of the terminal device is acquired.

In step S204, a system volume area corresponding to the current system volume parameter of the terminal device is determined.

The system volume parameter is divided into different ranges according to the audio loudness, and this range is the system volume area. For example, in terms of percentages, the maximum volume of the system volume parameter is 100%, and the minimum volume is 0%. The system volume area may be manually preset. For example, the system volume area is divided into a low volume area, a medium volume area, and a high volume area. First, the medium volume range is divided according to the user's commonly used volume range. Specifically, through random sampling statistics, it is acquired that the user's commonly used volume range is 40%-70%. Therefore, 0%-40% of the loudspeaker volume may be divided into the low volume area, 40%-60% of the loudspeaker volume may be divided into the medium volume area, and 60%-100% of the loudspeaker volume may be divided into a high volume area. In the low volume area, 0-6% of the loudspeaker volume may be divided into the extremely low volume area.

In step S206, the volume of audios in individual frequency ranges in the audio material is adjusted according to the system volume area and a frequency range of the audio material.

Generally, there are different audio mixing purposes for different system volume areas. Therefore, in different system volume areas, a respective audio mixing method is used for the audios in individual frequency ranges in the audio material, so as to achieve the purpose of targeted audio mixing for each system volume area. For example, the medium volume area is the most commonly used volume area for the user, which usually has a purpose of enhancing the hearing and ensuring that the user has comfortable experience. In addition, the audio mixing scheme for the medium volume area may be used as a standard scheme for the overall audio mixing, which provides reference and hearing standard for the audio mixing schemes of the high volume area and the low volume area; the high volume area should make its hearing close to that of the medium volume area, for example, appropriately decreasing the volume of the high frequency range audio in the audio material to ensure the sounding similar to that of the medium volume area; a purpose of the audio mixing in the low volume area is to allow the user to hear important audios, such as the information prompt audio, to improve the presentation of the important audio material.

Since a frequency band coverage of the audio material may be very wide, when the volume is adjusted, the volume corresponding to the audio of a certain frequency range contained in the audio material is usually adjusted, instead of increasing the overall volume of the audio material which may increase the volume of all frequency bands covered by the audio material. Specifically, considering that in most scenarios, important audios are usually in the medium frequency range or high frequency range. If the system volume area corresponding to the current system volume parameter is the preset low volume area, the volume of all audios are low, the overall audio performance is poor. At this time, there is a need to increase the performance of the preset medium frequency range or high frequency range of the audio material. That is, under the low volume, it is ensured first that the user is capable of hearing the important audios clearly, and the overall hearing of the audio is not a core consideration for the audio mixing in the low volume area. Compared with the low frequency range, the high frequency range and medium frequency range of the audio material have stronger overall audio performance; and the low frequency range of the audio material requires high volume to allow the user to hear clearly, the high frequency and medium frequency range of the audio material may be heard clearly without high volume. Therefore, if the system volume area is a preset low volume area, the volume of audios in a preset medium frequency range and/or a preset high frequency range in the audio material is increased, to ensure that the audio may be heard by the user as much as possible. The volume of the audios in the medium frequency range and high frequency range of the audio material may be increased at the same time, or only the volume of audios in the medium frequency range or the volume of audios in the high frequency range of the audio material may be increased. Because in the low volume area, even if the volume of the audio in the low frequency range of the audio material is raised to a high level, it is difficult to be heard. Under the premise that the key audio material may be heard, there is no need to increase the volume of the audio in the low frequency range, and there is even a need to decrease the volume of the audio in the low frequency range of the audio material to ensure that the volume does not exceed the highest threshold.

If the system volume area is a preset high volume area, the volume of audios in a medium frequency range and/or a high frequency range in the audio material is decreased, so that the overall hearing of the audio in the high volume area is close to that of the medium volume area. The volume of audios in the medium frequency range and the high frequency range in the audio material may be decreased at the same time, or only the volume of audio in the medium frequency range or the high frequency range in the audio material may be decreased. In the high volume area, the low frequency range of the audio material has a poor audio performance compared with the high frequency range of the audio material; and the audio performance of the medium frequency and high frequency range in the audio material is more prominent. In order to ensure a good hearing, in the high volume area, it is necessary to reduce the volume of the audio in the high frequency range and the medium frequency range of the audio material, so that the hearing of the audio in the low frequency, medium frequency and high frequency ranges in the audio material is close, making the overall hearing of the high volume area close to that of the medium volume area.

For example, due to the relatively small diaphragm of the loudspeaker of the mobile phone, the playback ability of the low frequency range in the audio material is poor, and the played audio is concentrated in the medium frequency and high frequency ranges. However, this will cause the audio to become harsher when the mobile phone plays the audio by means of the loudspeaker, resulting in poor hearing and an uncomfortable audio for the user, thereby reducing the hearing and quality of the audio. Therefore, in order to ensure that the hearing in the high volume area is close to that in the medium volume area, it is necessary to make the audio no longer concentrate in the high and low frequency ranges, reduce the volume of the audios in the medium frequency and high frequency ranges of the audio material, and increase the volume of the audios in the low frequency range of the audio material.

Figure 3:
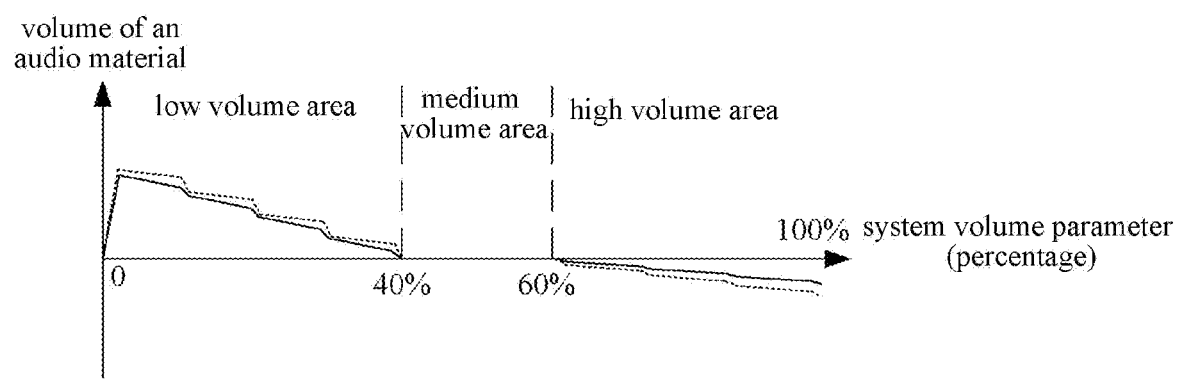
FIG. 3 is a schematic diagram of a manner for adjusting an audio mixing parameter of audios of the medium frequency and high frequency range in an audio material provided by an embodiment of the present disclosure.

As an example, FIG. 3 is a manner for adjusting an audio mixing parameter of audios in medium frequency and high frequency ranges of an audio material, an abscissa in FIG. 3 is a system volume parameter expressed as a percentage, and an ordinate is a volume of an audio material. "0" on the ordinate represents an unadjusted preset volume of the audio material, a positive number on the ordinate represents an increase in the volume of the audio material, and a negative number on the ordinate represents a decrease in the volume of the audio material. In FIG. 3, a solid line represents an audio in the high frequency range of the audio material, and a dotted line represents the audio in the medium frequency range or the audio in the medium and high frequency range of the audio material. As shown in FIG. 3, the volume of the audios in the high frequency range and the medium frequency range of the audio material in the medium volume area is not adjusted, the volume of the audios in the high frequency range and the medium frequency range of the audio material in the high volume area is reduced, and the volume of the audios in the high frequency range and the medium frequency range of the audio material in the low volume area is increased. The audio in the high volume area is concentrated in the high frequency range and the medium frequency range, and these two frequency ranges of the audio material do not need to be loud enough to be heard clearly, and if no adjustment is made, the user will feel harsh, so the volume of the audios in the high frequency range and the medium frequency range of the audio material needs to be decreased. Since the low frequency range of the audio material requires high volume to be heard clearly, the high frequency and medium frequency ranges of the audio material do not need a high volume to be heard, in the low volume area, if there is a requirement to ensure the audio may be heard by the player as much as possible, the volume of the of the audios in the high frequency range and the medium frequency range of the audio material needs to be increased.

A difference between the volume adjustment of the audios in the high frequency range and the audios in the medium frequency range of the audio material is the amplitude of reducing and increasing the volume. Under the same hearing, the volume required for the high frequency is generally lower than that required for the medium frequency. Therefore, in the high volume area, the high frequency needs to be attenuated more to approach the hearing effect in the medium volume area. In the low volume area, the high frequency needs less increase to achieve the same hearing effect as the medium frequency.

If the system volume area is the preset medium volume area, and the frequency range included in the audio material has the preset low frequency range, it is necessary to improve the hearing in the medium volume area. In the medium volume area, both the high frequency and medium frequency ranges of the audio material may be well represented; the low frequency performance ability is moderate. In order to improve the hearing, the volume of the audios in the preset low frequency range of the audio material should be increased, to enhance the performance of the low frequency range in the audio material.

Figure 4:
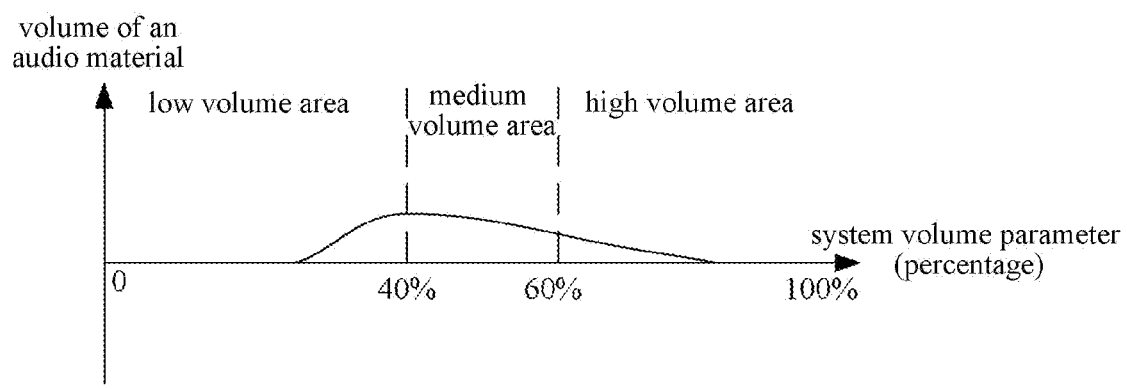
FIG. 4 is a schematic diagram of a manner for adjusting an audio mixing parameter of audios of the low frequency range in an audio material provided by an embodiment of the present disclosure.

As an example, FIG. 4 is a manner for adjusting an audio mixing parameter of audios in a low frequency of an audio material, an abscissa in FIG. 4 is a system volume parameter expressed as a percentage, and an ordinate is volume of an audio material. "0" on the ordinate represents an unadjusted preset volume of the audio material, a positive number on the ordinate represents an increase in the volume of the audio material, and a negative number on the ordinate represents a decrease in the volume of the audio material. A curve in FIG. 4 is an audio in the low frequency range of the audio material. It may be seen that the volume of the audio in the low frequency range of the audio material is increased in the medium volume area with the purpose to improve the hearing in the medium volume area.

At the same time, the volume of the audio in the low frequency range of the audio material is increased in a transition area between the high volume area and the medium volume area and in a transition area between the medium volume area and the low volume area, which may ensure that the hearing in the two transition areas is comfortable, and may increase the radiation range of comfortable hearing. A dynamic range in the medium volume area is relatively sufficient. Although the audio in the low frequency range of the audio material has improved performance in the medium volume area, due to the inherent problems of the hardware, the increase extent is not as good as the audio of the medium frequency range and high frequency range in the audio material. Under the premise of sufficient dynamic space, the audio in the low frequency range of the audio material may be improved to improve the hearing of the medium volume area. Because the dynamic space in the high volume area is not sufficient, in order to prevent audio overload, the manner for increasing the audio in the low frequency range of the audio material cannot be used for improving the performance of the low frequency range. The audio in the low frequency range of the audio material in the low volume area has lost their basic expressiveness, and increasing the volume of the audio in the low frequency range of the audio material cannot increase the expressiveness of the low volume area, so there is no need to make the increase.

In addition to the volume, the audio mixing parameter also includes a dynamic range of audios in individual frequency ranges in the audio material. Therefore, in addition to adjusting the volume of the audio of each frequency range in the audio material to adjust the audio mixing parameter of the audio material according to the system volume area and the frequency range of the audio material, the dynamic range of audios in individual frequency ranges in the audio material may also be adjusted according to the system volume area and the frequency range of the audio material.

The dynamic range refers to an average difference between the highest and the lowest in the volume fluctuation of the audio. Reducing the dynamic range may make the volume changes of the audio sound more moderate and gentle, thereby improving the audio performance. A way to reduce the dynamics is to rely on a compressor, not the adjustment of the volume. That is, the overall increase or decrease of the volume cannot reduce the dynamic range. When the volume is increased or decreased, the dynamic range generally does not change. However, since the maximum volume that the terminal device may withstand is limited, an upper threshold is set for the maximum volume. When the volume exceeds this upper threshold, it may be proportionally reduced below the upper threshold, or forced down to a value of the upper threshold. This process will narrow the difference between the maximum volume and the minimum volume, that is, narrow the dynamic range of the audio. This process is called compression. Meanwhile, a volume difference between the volume of the audio and the upper threshold is called dynamic space. The volume of the audio is composed of different volume corresponding to different frequencies, and the volume of different frequencies has its own dynamic range. These dynamic ranges are combined to form the overall dynamic range of the audio material. When the volume of a certain frequency or frequency band is adjusted, the result may affect the overall dynamic range of the audio and the volume.

If the system volume area is the preset low volume area, the dynamic range of the audio material needs to be narrowed. In the low volume area, it is a goal of hearing adjustment that the user can hear clearly. The audio performance of all frequency ranges of the audio material in the low volume area is poor. Although increasing the volume of the audios in the medium frequency and low frequency can increase the audio performance of these two frequency bands, which makes the audio be heard, the audio cannot be prevented from being fluctuated. Therefore, it is necessary to narrow the dynamic range of the audios in the medium frequency range and the high frequency range of the audio material in order to solve the problem of fluctuations in the audio. The audios in the low frequency range of the audio material may hardly be heard in the low volume area, but the audios in the medium and low frequency range may be heard. Therefore, it is necessary to distinguish between the low frequency range and the medium and low frequency range; narrow the dynamic range of the audio in the medium and low frequency range, in order to improve the hearing performance of the medium and low frequencies; at the same time, not to completely remove the medium and low frequency range is also to neutralize the bad hearing of the too thin audio with a strong sense of filtering caused by the increase of the high frequency range and the medium frequency range.

If the system volume area is the preset high volume area, the dynamic range of the audios in the preset low frequency range of the audio material needs to be narrowed. In the high volume area, the main purpose is to ensure good hearing; in the high volume area, the actual hearing of the audios in the low frequency range of the audio material is improved, but it is not enough. The dynamic range of the audios in the low frequency range needs to be narrowed to allow the audio in the low frequency range sounds thicker and more powerful. In the high volume area, the audios in the high frequency range and medium frequency range of the audio material are more expressive than the audios in the low frequency range, and generally, it is not necessary to narrow the dynamic range to increase the expressiveness of the audios in the high frequency range and medium frequency range of the audio material.

Figure 5:
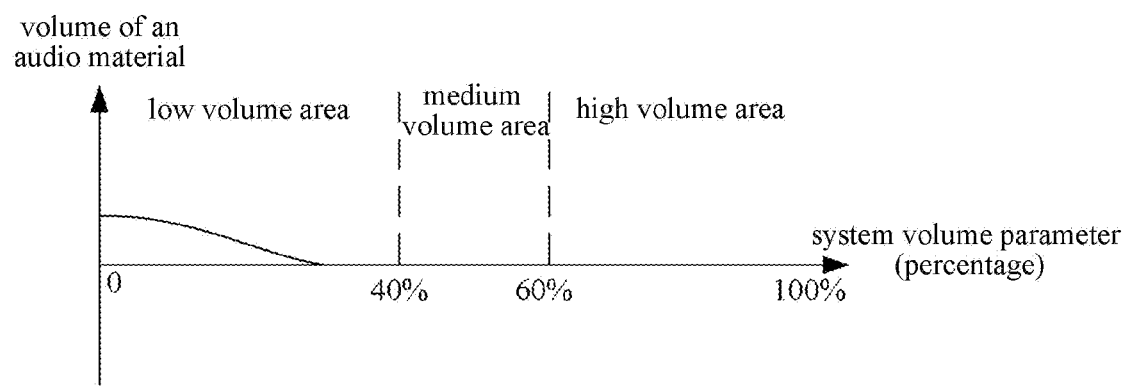
FIG. 5 is a schematic diagram of a dynamic spatial adjustment manner of audios in a low frequency range in an audio material provided by an embodiment of the present disclosure.

In addition, for a dynamic space adjustment method of the low frequency range in the audio material, as an example, FIG. 5 is a dynamic space adjustment method of an audio in a low frequency range of an audio material, where an abscissa is a system volume parameter expressed as a percentage, and an ordinate is a volume of an audio material. "0" on the ordinate represents an unadjusted volume of the audio material, a positive number on the ordinate represents an increase in the volume of the audio material, and a negative number on the ordinate represents a decrease in the volume of the audio material. A curve in FIG. 5 represents an audio in the low frequency range of the audio material. The audio in the low frequency range of the audio material releases the dynamic space in the low volume area to the audios in the high frequency range and medium frequency range of the audio material, which may prevent the overall volume from exceeding the maximum threshold, while increasing the expressiveness of the audios in the high frequency range and medium frequency range of the audio material, and ensuring the user may hear the audio.

In step S208, audio mixing processing is performed on the audio material according to the audio mixing parameter.

In an actual implementation, the audio mixing processing may be performed by an audio engine Wwise. After acquiring the system volume parameter fed back by the terminal device, Wwise associates it with its own RTPC (Real-time Parameter Controls) parameters, for real-time audio mixing control. The system volume parameter and the frequency of each audio material may be displayed on the RTPC parameter interface, and the audio mixing parameter may be preset or adjusted on the RTPC parameter interface.

In step S210, the audio material after the audio mixing processing is played.

In the above method, through RTPC, according to the volume parameters of the mobile phone, the volume of the audios in the medium frequency or high frequency range of the audio material in the preset low volume area is increased in real time, and the volume of the audio in the low frequency range is decreased; the volume of the audios in the medium frequency or high frequency range of the audio material in the preset high volume area is decreased; the volume of the audios in the low frequency range of the audio material in the preset medium volume area is increased; the dynamic range of the audio of the audio material in the preset low volume area is narrowed; and the dynamic range of the audio in the low frequency range of the audio material in the preset high volume area is narrowed. The real-time adjustment of the audio material according to the frequency range and volume area is realized, the dynamic range and volume of the audio are adjusted in real time respectively, so that the medium volume area enhances the user's hearing, and the hearing in the high volume area is close to that of the medium volume area, and the presentation of the audio material is improved in the low volume area.

Figure 6:
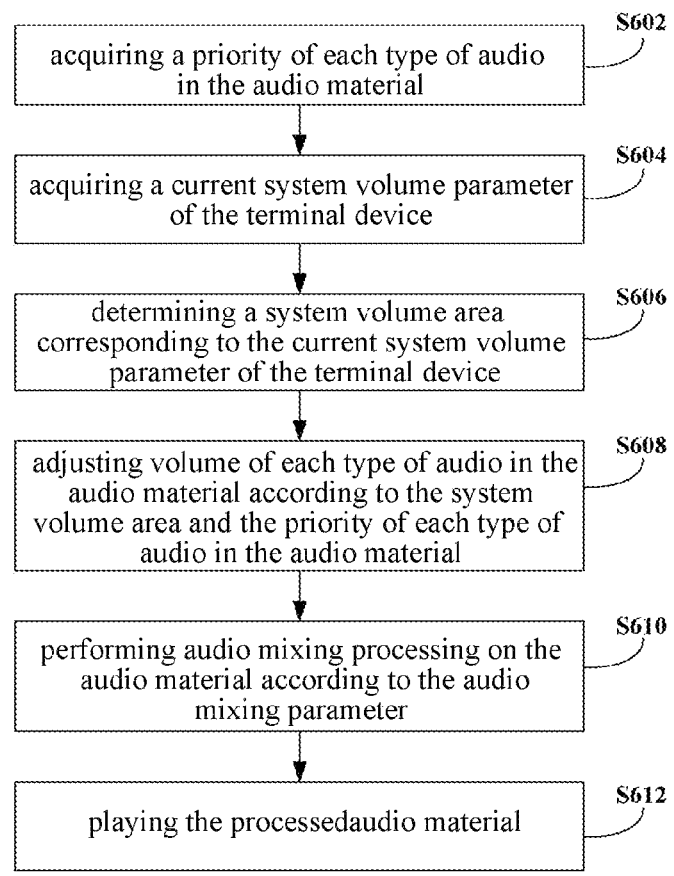
FIG. 6 is a flowchart of another audio mixing method provided by an embodiment of the present disclosure.

The embodiments of the present disclosure also provides another audio mixing method; this method is implemented on the basis of the method in the above embodiments; in the above embodiments, the adjusting the volume and dynamic range of the audio material belongs to macro adjustment, and the macro adjustment may be understood as: adjustment of the overall volume and dynamic range of each frequency range under different system volume areas. In the embodiment, the audio mixing parameter of each audio material is micro-adjusted according to a priority of each type of audio in each audio material. FIG. 6 is a flowchart of an audio mixing method, where the method includes the following steps.

In step S602, a priority of each type of audio in the audio material is acquired.

In step S604, a current system volume parameter of the terminal device is acquired.

In step S606, a system volume area corresponding to the current system volume parameter of the terminal device is determined.

The priority of each type of audio in the audio material represents a priority of playing the audio material, or a priority of ensuring a volume or dynamic space of the audio material when playing the audio material. The higher the priority of each type of audio in the audio material is, the earlier the audio material will be played, or the earlier the volume and dynamic space of the audio material will be guaranteed. In an actual implementation, if the total volume of the audio in each frequency range of the audio material has an upper limit, the priority is given to the volume of the audio material of high priority. After the upper limit of the audio is reached, other unplayed audio materials of low priority are no longer played. If the total dynamic space of each frequency range of the audio material has an upper limit, the priority is given to the dynamic space of the audio material of high priority, and the dynamic space of the audio material of low priority may be compressed, and even the audio material may not be played.

In an actual implementation, the priority may be divided according to the application of the audio material. A necessary information transmission audio, that is, an important audio effect, is set to be a high priority. The necessary information transmission audio includes: UI (User Interface) audio effect with a key prompt function, hit audio effect, Buff audio effect and Debuff audio effect, and the corresponding voices mentioned above; basic audio elements are set to be the medium priority, the basic audio elements include: basic UI audio effect, action and special effect audio effect, object audio effect and corresponding voice, etc.; decorative, emotional and atmospheric audios are set to be low priority, and the decorative, emotional, and atmospheric audios include: environmental audio effect, emotional atmosphere audio effect, audio field modification effect, or the like.

In step S608, the volume of each type of audio in the audio material is adjusted according to the system volume area and the priority of each type of audio in the audio material.

The adjusting the volume according to the different priorities of various types of audios in the audio material is micro adjustment. The micro adjustment refers to the adjustment of the volume of an audio in a certain or a certain type of audio material under different system volume areas. The micro adjustment includes the different priority divisions for different audio materials or different types of audio materials under different system volume areas, and different adjustments of frequency, dynamics, volume, and memory occupancy under different system volume areas according to the priority of each type of audio in the audio material.

The macro adjustment is usually rough. The macro hearing processing is a scheme that takes an average fixed value for the overall performance of the audio. This scheme is not suitable for every specific audio effect or every specific piece of music. Under the macro adjustment, the performance of some audio materials may be too strong, and some may still be poor. On this basis, the micro-adjustment may ensure that each audio may achieve comfortable hearing experience.

Compared with the macro adjustment, the micro adjustment may make more volume adjustments to the audio material, but such adjustments are not the most necessary means. Because the volume adjustment increase or decrease the overall frequency range and the dynamic range covered by the audio, simply adjusting the volume of the material is not the best way. Due to the impact of the macro adjustment, some audio materials will be less expressive. At this time, it may consider to increase the overall volume of the audio material itself, depending on the specific situation.

First, an audio mixing adjustment scheme of audio materials with different priorities in the low volume area is analyzed. If the system volume area is the preset low volume area, then the volume of the audio with the preset high priority in the audio material is increased. The reason for this is to ensure that the audio material with the high priority must be heard by the user or player in the low volume area.

For example, if the system volume area is the preset low volume area and the priority of the audio material is the preset high priority, then the volume of the audios in the preset medium frequency range or the preset high frequency range of the audio material needs to be increased. If the system volume area is the preset low volume area, and the priority of each type of audio in the audio material is the preset medium priority, then the volume of at least part of the audios in the preset medium frequency range or the preset high frequency range of the audio material needs to be increased, and the volume of a portion of the audio materials is appropriately increased. In the low volume area, the audio of the audio material with the medium priority needs to be heard by the user as much as possible, the volume of a part of the audios in the medium frequency range or the high frequency range of the audio material with the medium priority needs to be increased. For the audio material with the low priority, whether it may be heard by the user in the low volume area is not the primary consideration.

Then, an audio mixing adjustment scheme of audio materials with different priority in the high volume area is analyzed. If the system volume area is the preset high volume area, the volume of the audio with the preset high priority in the audio material needs to be decreased. In the high volume area, the main purpose of the audio mixing is to improve the hearing. In order to improve the hearing, it is necessary to ensure that the volume of audio materials with the high, medium, and low priority is close. Therefore, the volume of the audio with the high priority needs to be reduced.

For example, if the system volume area is the preset high volume area, and the priority of each type of audio in the audio material is the preset high priority or medium priority, the volume of at least part of the audios in the medium frequency range or the high frequency range of the audio material needs to be decreased. In the high volume area, it is necessary to give priority to the hearing. Therefore, the volume of the audios in the medium frequency range or the high frequency range of some audio materials in the high volume area needs to be decreased, and it is necessary to adjust the dynamic range. Specifically, it can mainly focus on adjusting some audios in the high frequency range and the low frequency range. During the adjustment, the priority is given to the audio material with the high priority.

In addition, important audio effects are very important to the user who is playing games, and it must ensure that the user may hear them, and ensure that the user may acquire the good hearing at the same time. No matter which frequency range the important audio effects belong to and the volume area to which the loudspeaker belongs, the hearing effect and presentation must usually be guaranteed. Therefore, in the low volume area, priority should be given to ensuring that the audio information may be effectively communicated, and in the high volume area, priority should be given to ensuring a good hearing, thereby avoid causing the key audio information unable to be effectively communicated to the user in the low volume area, and bringing uncomfortable and interrupted experience to the user due to the bad hearing in the high volume area.

Figure 7:
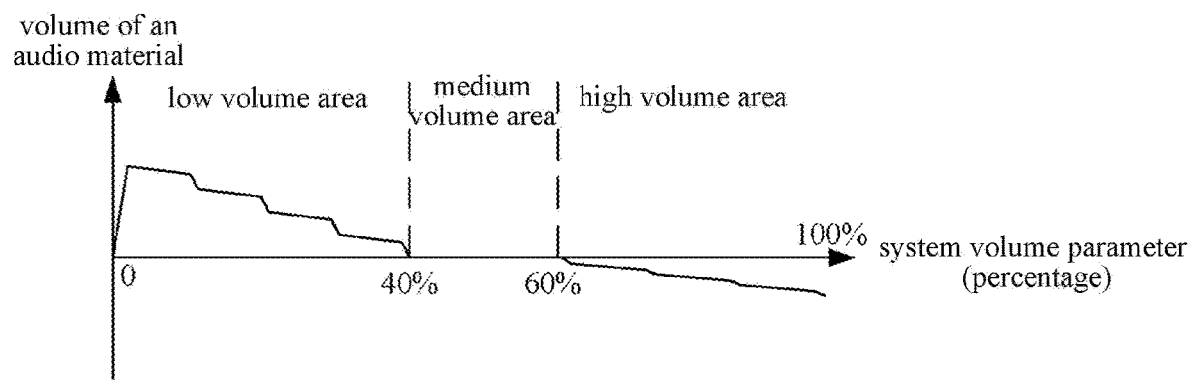
FIG. 7 is a schematic diagram of a manner for adjusting an audio mixing parameter of an important audio effect audio material provided by an embodiment of the present disclosure.

There is no limit to the frequency range included in the important audio effect, but it usually has a higher priority. Generally speaking, most important audio effects include audios in the high frequency range or the medium frequency range. This is because the audios in the medium frequency range or the high frequency range are better presented at the same volume and are easier to be heard by the user. As an example, FIG. 7 is a manner for adjusting an audio mixing parameter of an important audio effect audio material, where an abscissa is a system volume parameter expressed as a percentage, and an ordinate is a volume of an audio material. "0" on the ordinate represents an unadjusted volume of the audio material, a positive number on the ordinate represents an increase in the volume of the audio material, and a negative number on the ordinate represents a decrease in the volume of the audio material. A curve in FIG. 7 represents an audio material of important audio effects, and the important audio effects include audios in the medium frequency or high frequency range. Therefore, the volume of the important audio effect in the low volume area is increased to ensure that the user may also hear the important audio effect in the low volume area; in addition, the volume of the important audio effect in the high volume area needs to be decreased to ensure the comfort of hearing.

In step S610, audio mixing processing is performed on the audio material according to the audio mixing parameter.

In step S612, the audio material after the audio mixing processing is played.

In the above method, first, the audio materials are divided into the high priority, the medium priority, and the low priority according to application conditions, and different audio mixing schemes are adopted for different audio materials in different system volume areas. Specifically, in the low volume area, it is necessary to increase the volume of the audios in the medium frequency or high frequency range of the high priority audio material, and increase the volume of at least part of the audios in the medium frequency range or the high frequency range of the medium priority audio material; in the high volume area, it is necessary to decrease the volume of the audios in the medium frequency range or the high frequency range of the high priority audio material or the medium priority audio material. This manner may adjust the audio mixing of different priorities respectively, improve the comfort of hearing in the high volume area, increase the presentation of the audio material in the low volume area, and ensure that the high priority audio material has strong presentation in all the system volume areas.

The embodiments of the present disclosure also provide another audio mixing method; this method is implemented on the basis of the method in the above-mentioned embodiments; the method focuses on describing specific implementation of adjusting the consumption optimization of medium priority or low priority audio materials in the low volume area.

The optimization of the micro-adjustment is mainly aimed at the volume from the low volume area to 0%, for example, a volume range of 30%-0%. A main processing method of optimization is to convert the audio material that has lost the hearing effect into a virtual voice playing by decreasing the volume. In the virtual voice, the audio has multiple playback manners, and each manner corresponds to a different optimization effect. For example, the loop audio effect and the long audio effect may adopt the form of continuing to play, and the short audio effect may adopt the form of stopping play. The performance optimization is based on the hearing effect. If a certain audio is almost impossible to be heard by the player at a certain system volume value in the low volume area, and the category of the audio effect is in the low priority or the medium priority, it is considered to be converted into the virtual voice.

In this method, if the system volume area is the preset low volume area, and the priority of each type of audio in the audio material is the preset low priority, the virtual voice processing is performed on the audio material; if the system volume area is the preset low volume area, and the priority of each type of audio in the audio material is the preset medium priority, the virtual voice processing is performed on at least a part of the audio materials. In the actual implementation, in the case of poor hearing in the low volume area, the low priority audio materials may be completely converted in the virtual voice; while for the medium priority audio materials, some of them may be converted in virtual voice.

For example, if the current system volume parameter is lower than a specified value in the preset low volume area, that is, in the extremely low volume area of the low volume area, the specified value is expressed as a percentage, which may be 6%. If the system volume parameter is lower than 6%, it means it is in the extremely low volume area. In the extremely low volume area, the overall fullness and expressiveness of the audio material may no longer be guaranteed. In this case, it is necessary to perform virtual voice processing according to the different presentation of specific audio materials and their roles in the game.

A virtual voice is virtual environment in which the audio engine monitors specific parameters of the audios in the list, but does not perform audio processing. Through the virtual voice processing, the number of playback channels may be limited for the specified audio material. For example, some audio materials with main frequency bands concentrated in the low frequency range are extremely difficult to be heard by the user in the extremely low volume area, and the audio materials concentrated in the low frequency range are extremely difficult to be heard by the user, but they will always be played. The low frequency range in these audio materials will occupy corresponding dynamic space and cause a waste of system performance. For these audio materials, the virtual voice processing may be performed to optimize the system performance. Because the virtual voice processing may release certain dynamic space, the presentation of other audio materials is improved, and the comfort of hearing is increased.

Generally, the low frequency range of the audio material in the low volume area has a low priority. For audio materials whose main frequency bands are concentrated in the low frequency range, reducing the number of played audio materials may optimize the performance of the game; at the same time, after reducing the audio playback of the low frequency range in the audio material, it may also help other high priority audio materials have better dynamic presentation.

Figure 8:
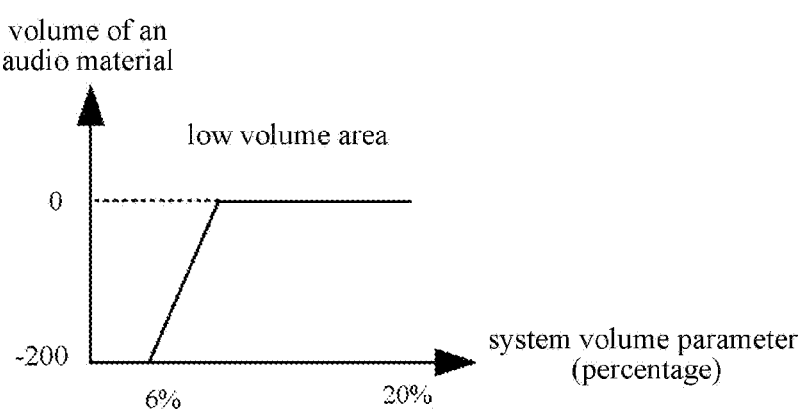
FIG. 8 is a schematic diagram of a virtual voice processing method provided by an embodiment of the present disclosure.

As an example, FIG. 8 is a virtual voice processing method, where an abscissa is a system volume parameter expressed as a percentage, and an ordinate is a volume of an audio material. "0" on the ordinate represents an unadjusted volume of the audio material, and a negative number on the ordinate represents a decrease in the volume of the audio material. A curve in FIG. 8 represents an audio material processed by the virtual voice. The part where the abscissa is less than 6% in FIG. 8 is the extremely low volume area. In the extremely low volume area, the volume of the audio material is reduced to trigger the function of the virtual voice.

The virtual voice includes a variety of playback settings, in which no playing, pause or continuing to play may be chosen. The virtual voice is a way to save memory consumption. Even if the audio continues to play in the virtual voice, the occupied consumption will be significantly reduced. The setting and selection of virtual voice need to be decided to stop, pause or resume playing according to the role and functionality of the specific audio material. For example, the audio with a volume lower than −40 db may be set into the virtual voice, and the number of audio playback channels of the audio material entering the virtual voice is limited to at most 256.

In the above manner, by performing the virtual voice processing on the medium priority or low priority audio materials in the low volume area, the performance of the game may be optimized, and other high priority audio materials can have better dynamic presentation.

It should be noted that the foregoing method embodiments are described in a progressive manner, and each embodiment focuses on the differences from other embodiments, and the same or similar parts between the various embodiments may be referred to each other.

Figure 9:
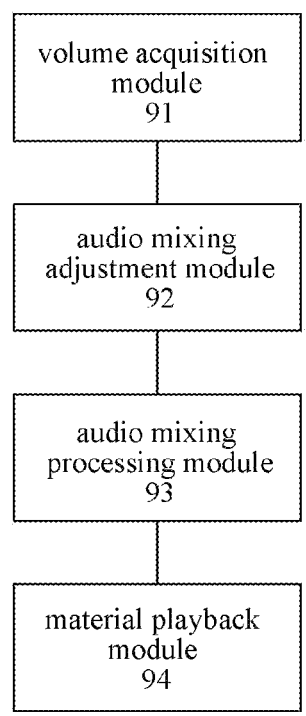
FIG. 9 is a schematic structural diagram of an audio mixing device provided by an embodiment of the present disclosure.

Corresponding to the above method embodiments, the embodiments of the present disclosure provides an audio mixing device, applied to terminal device. As shown in FIG. 9, the device includes:
- a volume acquisition module 91, configured to acquire a current system volume parameter of the terminal device;
- an audio mixing adjustment module 92, configured to adjust an audio mixing parameter of an audio material according to the system volume parameter and a frequency range of the audio material;
- an audio mixing processing module 93, configured to perform the audio mixing processing on the audio material according to the audio mixing parameter; and
- a material playback module 94, configured to play the audio material after the audio mixing processing.

The audio mixing device provided by the embodiments of the present disclosure adjusts the audio mixing parameter of the audio material according to the acquired current system volume parameter of the terminal device and the frequency range of the audio material, and further performs the audio mixing processing on the audio material according to the audio mixing parameter, and plays the audio material. The manner considers the system volume parameter and the frequency range of the audio material when adjusting the audio mixing parameter. Compared with the related art in which a fixed mixing scheme is used under any system volume parameter, the above method may use different mixing parameters for the audio material under different system volume parameters. Therefore, this method may reduce the hearing difference of the audio at different volume, the user may acquire comfortable hearing under various volume, which improves the user's hearing experience.

In some embodiments, the audio mixing parameter includes volume of audios in individual frequency ranges in the audio material; the audio mixing adjustment module is configured to determine a system volume area corresponding to the current system volume parameter of the terminal device; and adjust the volume of audios in individual frequency ranges in the audio material according to the system volume area and a frequency range of the audio material.

In some embodiments, the audio mixing adjustment module is configured to: increase the volume of audios in a preset medium frequency range and/or a preset high frequency range in the audio material if the system volume area is a preset low volume area; and decrease the volume of the audios in the medium frequency range and/or the high frequency range in the audio material if the system volume area is a preset high volume area.

In some embodiments, the audio mixing adjustment module is configured to: increase the volume of audios in a preset low frequency range in the audio material if the system volume area is a preset medium volume area.

In some embodiments, the audio mixing parameters also include a dynamic range of audios in individual frequency ranges in the audio material; the audio mixing adjustment module is configured to: decrease the dynamic range of the audio material if the system volume area is a preset low volume area; and decrease the dynamic range of audios of a preset low frequency range of the audio material if the system volume area is a preset high volume area.

In some embodiments, the device further includes: a priority acquiring module, configured to acquire a priority of each type of audio in the audio material; and a volume adjustment module, configured to adjust the volume of each type of audio in the audio material according to the system volume area and the priority of each type of audio in the audio material.

In some embodiments, the volume adjustment module is configured to: increase the volume of a preset high priority audio in the audio material if the system volume area is a preset low volume area; and decrease the volume of the preset high priority audio in the audio material if the system volume area is a preset high volume area.

In some embodiments, the device further includes: a virtual voice processing module, configured to perform virtual voice processing on a preset low priority audio in the audio material if the system volume area is a preset low volume area.

The audio mixing device provided by the embodiments of the present disclosure has the same technical features as the audio mixing method provided in the foregoing embodiments, so it may also solve the same technical problem and achieve the same technical effect.

Figure 10:
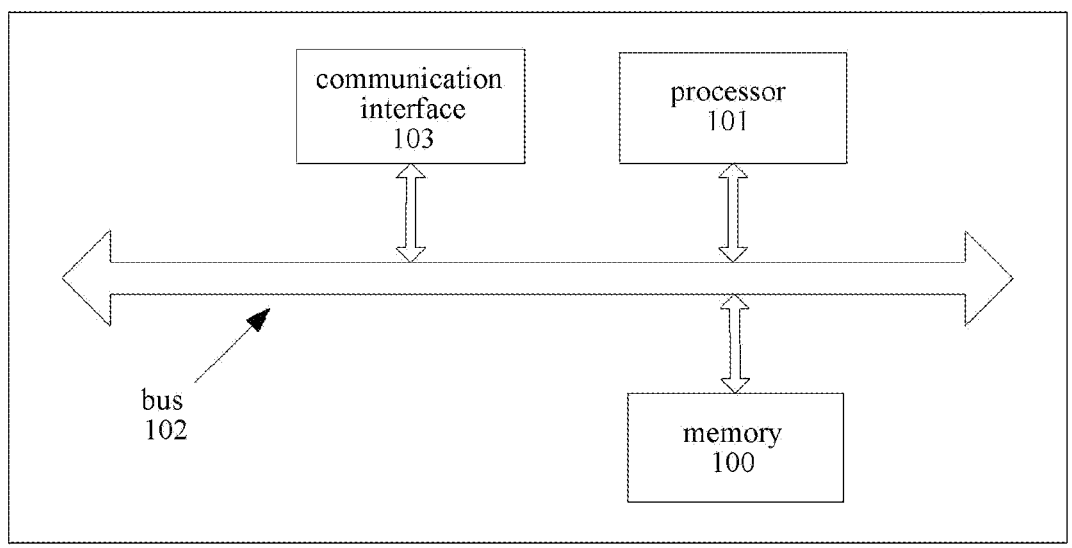
FIG. 10 is a schematic structural diagram of a terminal device provided by an embodiment of the present disclosure.

The embodiments of the present disclosure also provide a terminal device, configured to run the above audio mixing method. As shown in FIG. 10, the terminal device includes a memory 100 and a processor 101, and the memory 100 is used for storing one or more computer instructions, which when executed by the processor 101, implement the above audio mixing method.

Further, the terminal device shown in FIG. 10 further includes a bus 102 and a communication interface 103, and the processor 101, the communication interface 103, and the memory 100 are connected through the bus 102.

The memory 100 may include a high-speed random access memory (RAM), and may also include a non-volatile memory, such as at least one disk memory. The communication connection between a network element of the system and at least one other network element is realized through at least one communication interface 103 (which may be wired or wireless), and the Internet, a wide area network, a local network, a metropolitan area network, etc. may be used. The bus 102 may be an ISA bus, a PCI bus, an EISA bus, or the like. The bus may be divided into an address bus, a data bus, a control bus, etc. For ease of presentation, only one bidirectional arrow is used for presentation in FIG. 10, but it does not mean that there is only one bus or one type of bus.

The processor 101 may be an integrated circuit chip with signal processing capability. In the implementation process, the steps of the above method may be completed by a hardware integrated logic circuit in the processor 101 or instructions in the form of software. The processor 101 may be a general-purpose processor, including a central processing unit (CPU), a network processor (NP), etc.; it may also be a digital signal processor (DSP), an application specific integrated circuit (ASIC), a field-programmable gate array (FPGA) or other programmable logic devices, discrete gates or transistor logic devices, discrete hardware components, which may implement or execute the methods, steps, and logical block diagrams disclosed in the embodiments of the present disclosure. The general-purpose processor may be a microprocessor or the processor may also be any conventional processor or the like. The steps of the method disclosed in the embodiments of the present disclosure may be directly embodied as being executed and completed by a hardware decoding processor, or executed and completed by a combination of hardware and software modules in the decoding processor. The software module may be located in a mature storage medium in the field, such as a random access memory, a flash, a read-only memory, a programmable read-only memory, or an electrically erasable programmable memory, a register. The storage medium is located in the memory 100, and the processor 101 reads the information in the memory 100, and completes the steps of the method of the foregoing embodiments in combination with its hardware.

The embodiments of the present disclosure also provide a computer-readable storage medium that stores computer-executable instructions, which when called and executed by a processor, cause the processor to implement the above audio mixing method. For the specific implementation, reference may be made to the method embodiments, which will not be repeated here.

Computer program product of the method and device for audio mixing, and terminal device provided by the embodiments of the present disclosure includes a computer-readable storage medium storing program codes. The instructions included in the program codes may be used for executing the methods in the previous method embodiments, and for the specific implementation, reference may be made to the method embodiments, which will not be repeated here.

Those skilled in the art may clearly understand that, for the convenience and conciseness of description, specific working processes of the device and/or terminal device described above may refer to the corresponding processes in the foregoing method embodiments, which will not be repeated here.

Finally, it should be noted that the above embodiments are only specific implementations of the present disclosure, which are used for illustrating the technical solutions of the present disclosure without limiting the present disclosure. A protection scope of the present disclosure is not limited thereto, although the present disclosure is described in detail with reference to the foregoing embodiments, those of ordinary skill in the art should understand that anyone familiar with the technical field can still modify or easily think of changes to the technical solutions described in the foregoing embodiments within the technical scope disclosed in the present disclosure, or equivalently replace some of the technical features; and these modifications, changes or substitutions do not deviate the essence of the corresponding technical solutions from the spirit and scope of the technical solutions of the embodiments of the present disclosure, and should be covered within the protection scope of the present disclosure. Therefore, the protection scope of the present disclosure shall be subject to the protection scope of the claims.

What is claimed is:

1. An audio mixing method, comprising:
   acquiring a current system volume parameter of a terminal device;
   adjusting an audio mixing parameter of an audio material according to the system volume parameter and a frequency range of the audio material;
   performing audio mixing processing on the audio material according to the audio mixing parameter; and
   playing the processed audio material,
   wherein adjusting the audio mixing parameter of the audio material according to the system volume parameter and the frequency range of the audio material comprises:
   determining a system volume area corresponding to the current system volume parameter of the terminal device,
   acquiring a priority of each type of audio in the audio material; and
   adjusting volume of each type of audio in the audio material according to the system volume area and the priority of each type of audio in the audio material.

2. The method according to claim 1, wherein the audio mixing parameter comprises volume of an audio in each frequency range in the audio material;
   adjusting the audio mixing parameter of the audio material according to the system volume parameter and the frequency range of the audio material further comprises:
   adjusting the volume of the audio in each frequency range in the audio material according to the system volume area and the frequency range of the audio material.

3. The method according to claim 2, wherein adjusting the volume of the audio in each frequency range in the audio material according to the system volume area and the frequency range of the audio material comprises:
   increasing volume of an audio in a preset medium frequency range and/or a preset high frequency range in the audio material when the system volume area is a preset low volume area; and
   decreasing the volume of the audio in the preset medium frequency range and/or the high frequency range in the audio material when the system volume area is a preset high volume area.

4. The method according to claim 2, wherein adjusting the volume of the audio in each frequency range in the audio material according to the system volume area and the frequency range of the audio material comprises:
increasing volume of an audio in a preset low frequency range in the audio material when the system volume area is a preset medium volume area.

5. The method according to claim 2, wherein the audio mixing parameter further comprises a dynamic range of the audio in each frequency range in the audio material;
adjusting the volume of the audio in each frequency range in the audio material according to the system volume area and the frequency range of the audio material comprises:
narrowing a dynamic range of the audio material when the system volume area is a preset low volume area; and
narrowing a dynamic range of an audio in a preset low frequency range in the audio material when the system volume area is a preset high volume area.

6. The method according to claim 1, wherein adjusting the volume of each type of audio in the audio material according to the system volume area and the priority of each type of audio in the audio material comprises:
increasing volume of an audio with a preset high priority in the audio material when the system volume area is a preset low volume area; and
decreasing the volume of the audio with the preset high priority in the audio material when the system volume area is a preset high volume area.

7. The method according to claim 1, further comprising:
performing virtual voice processing on an audio with a preset low priority in the audio material when the system volume area is a preset low volume area.

8. A terminal device, comprising a processor and a memory, wherein the memory stores computer executable instructions that are executed by the processor, and the processor is configured to:
acquire a current system volume parameter of the terminal device;
adjust an audio mixing parameter of an audio material according to the system volume parameter and a frequency range of the audio material;
perform the audio mixing processing on the audio material according to the audio mixing parameter; and
play the processed audio material,
wherein the processor is further configured to:
determine a system volume area corresponding to the current system volume parameter of the terminal device;
acquire a priority of each type of audio in the audio material; and
adjust volume of each type of audio in the audio material according to the system volume area and the priority of each type of audio in the audio material.

9. A non-transitory computer-readable storage medium, wherein the non-transitory computer-readable storage medium stores computer executable instructions that, when called and executed by the processor, causes the processor to:
acquire a current system volume parameter of the terminal device;
adjust an audio mixing parameter of an audio material according to the system volume parameter and a frequency range of the audio material;
perform audio mixing processing on the audio material according to the audio mixing parameter; and
play the processed audio material,
wherein the processor is further configured to:
determine a system volume area corresponding to the current system volume parameter of the terminal device;
acquire a priority of each type of audio in the audio material; and
adjust volume of each type of audio in the audio material according to the system volume area and the priority of each type of audio in the audio material.

10. The method according to claim 1, wherein the priority of each type of audio in the audio material represents a priority of playing the audio material.

11. The method according to claim 1, wherein the priority of each type of audio in the audio material represents a priority of ensuring a volume or dynamic space of the audio material when playing the audio material.

12. The method according to claim 2, wherein adjusting the volume of the audio in each frequency range in the audio material according to the system volume area and the frequency range of the audio material comprises:
decreasing volume of an audio in a preset medium frequency range and/or a preset high frequency range in the audio material, and increasing volume of an audio in a preset low frequency range in the audio material when the system volume area is a preset high volume area.

13. The method according to claim 5, narrowing a dynamic range of the audio material when the system volume area is a preset low volume area comprises:
narrowing a dynamic range of an audio in a preset medium frequency range in the audio material and/or a preset high frequency range in the audio material when the system volume area is a preset low volume area.

14. The method according to claim 6, wherein increasing volume of an audio with a preset high priority in the audio material when the system volume area is a preset low volume area comprises:
increasing the volume of the audios in the preset medium frequency range or the preset high frequency range of the audio material with a preset high priority in the audio material when the system volume area is a preset low volume area.

15. The method according to claim 1, wherein adjusting the volume of each type of audio in the audio material according to the system volume area and the priority of each type of audio in the audio material comprises:
increasing the volume of at least part of the audios in the preset medium frequency range or the preset high frequency range of the audio material with a preset medium priority in the audio material when the system volume area is a preset low volume area.

16. The method according to claim 6, wherein decreasing the volume of the audio with the preset high priority in the audio material when the system volume area is a preset high volume area comprises:
decreasing the volume of at least part of the audios in the medium frequency or the high frequency range of the audio material with a preset high priority in the audio material when the system volume area is a preset high volume area.

17. The method according to claim 1, further comprising:
performing virtual voice processing on at least a part of the audio material with a preset medium priority in the audio material when the system volume area is a preset low volume area.

18. The terminal device according to claim 8, wherein the audio mixing parameter comprises volume of an audio in each frequency range in the audio material;
wherein the processor is further configured to:
adjust the volume of the audio in each frequency range in the audio material according to the system volume area and the frequency range of the audio material.

19. The terminal device according to claim 18, wherein the processor is further configured to:
increase volume of an audio in a preset medium frequency range and/or a preset high frequency range in the audio material when the system volume area is a preset low volume area; and
decrease the volume of the audio in the medium frequency range and/or the high frequency range in the audio material when the system volume area is a preset high volume area.

\* \* \* \* \*